(12) United States Patent
Moreau et al.

(10) Patent No.: US 8,901,952 B2
(45) Date of Patent: Dec. 2, 2014

(54) CIRCUIT TESTING DEVICE AND METHOD FOR IMPLEMENTING SAME

(75) Inventors: Katell Moreau, Paris (FR); Marc Grieu, Ivry sur Seine (FR)

(73) Assignee: European Aeronautics Defence and Space Company Eads France, Paris (FR)

( * ) Notice: Subject to any disclaimer, the term of this patent is extended or adjusted under 35 U.S.C. 154(b) by 707 days.

(21) Appl. No.: 13/140,418

(22) PCT Filed: Dec. 15, 2009

(86) PCT No.: PCT/FR2009/052538
§ 371 (c)(1),
(2), (4) Date: Oct. 20, 2011

(87) PCT Pub. No.: WO2010/076482
PCT Pub. Date: Jul. 8, 2010

(65) Prior Publication Data
US 2012/0025864 A1    Feb. 2, 2012

(30) Foreign Application Priority Data

Dec. 17, 2008  (FR) ..................................... 08 58735

(51) Int. Cl.
*G01R 31/28*  (2006.01)
*G01R 31/04*  (2006.01)

(52) U.S. Cl.
CPC .......... *G01R 31/048* (2013.01); *G01R 31/2817* (2013.01)
USPC .................................................. 324/763.01

(58) Field of Classification Search
CPC . H05K 13/0465; H05K 13/08; H05K 3/3447; H05K 2201/0305; H05K 3/101; H01R 9/091; G01K 13/10; G01K 31/048; G01K 31/28–31/30; G01K 31/046; G01K 31/318544; G01K 31/2817; G01D 5/00; G01M 7/025
See application file for complete search history.

(56) References Cited

U.S. PATENT DOCUMENTS

| 6,564,986 | B1   |   | 5/2003 | Hsieh |         |
|-----------|------|---|--------|-------|---------|
| 6,750,899 | B1   | * | 6/2004 | Fishbaine et al. | ............. 348/126 |
| 6,847,900 | B2   | * | 1/2005 | Ragland | .......................... 702/35 |
| 7,360,439 | B2   | * | 4/2008 | Kuroda et al. | ................... 73/774 |

(Continued)

OTHER PUBLICATIONS

Przemyslaw Matkowski et al., "Application of FPGA units in combined temperature cycle and vibration reliability tests of lead-free interconnections" $2^{nd}$ Electronics Systemintegration Technology Conference, IEEE, Piscataway, NJ, USA, Sep. 1, 2008, pp. 1375-1380.

(Continued)

*Primary Examiner* — Vinh Nguyen
(74) *Attorney, Agent, or Firm* — IM IP Law PLLC; C. Andrew Im

(57) ABSTRACT

A device for testing a circuit made up of a printed circuit board on which components, preferably dummy components, are assembled by the solder connections. An enclosure of the testing device subjects the circuit under test to a schedule of thermo-mechanical and/or vibration constraints. Bridges of electrical resistors, forms a hardware portion of the testing device. A software portion of the testing device sets a detection criterion representing damage to one or more solder connections and displays the results of the test. An input/output interface converts each electrical resistor measurement of the tested chains of solder connections into data for use the software portion. An adjusting component modifies the criterion for detecting damage to the solder connections.

14 Claims, 2 Drawing Sheets

(56) References Cited

U.S. PATENT DOCUMENTS

2004/0036466 A1    2/2004   Berkely
2005/0225754 A1*   10/2005   Ume et al. ................. 356/237.1
2007/0199386 A1    8/2007   Kuroda et al.

OTHER PUBLICATIONS

Philippe Prieur et al., "ROHS/ELV recycling constraints: a Lead Free electronics qualification procedure for automotive & industrial quality and reliability", 4$^{th}$ International Electronics Conference, Apr. 26, 2006, Malmo, Sweden.

* cited by examiner

CIRCUIT TESTING DEVICE AND METHOD FOR IMPLEMENTING SAME

RELATED APPLICATIONS

This application is a §371 application from PCT/FR2009/052538 filed Dec. 15, 2009, which claims priority from French Patent Application No. 08 58735 filed Dec. 17, 2008, each of which is herein incorporated by reference in its entirety.

TECHNICAL FIELD OF INVENTION

This invention relates to an electronic circuit board testing device and its method of implementation. It deals with a device for detecting cracks in solder connections forming the assembly of electronic components on a printed circuit board. The invention also relates to the method of operating this device. The purpose of the invention is to allow a user to qualify such a circuit, which means quickly and easily detecting incipient cracks located in the solder connections of electronic components assembled on a printed circuit board.

BACKGROUND OF THE INVENTION

In the prior art, electronic components can sustain very strong constant or cyclic environmental and mechanical stress, such as for example in methods of transportation involving airplanes, trains, or boats. In the mentioned methods of transportation, temperatures can range from −55° C. to 125° C., and the relative humidity of a cabinet in which these electronic components are located can reach about 80%.

It is therefore important, for reasons of operational safety, to verify that the assembly of electronic components assembled on a printed circuit board support such stress. For this, we generally use test beds to detect any incipient cracks in the solder connections that provide the electrical connection and mechanical link between the component and the printed circuit board. These test beds are used during accelerated aging tests involving thermo-mechanical or vibration stress. Dummy components (meaning only the boxes with dummy chips) are used to carry out the thermo-mechanical or vibration accelerated aging tests because only the solder connections are tested here. By "daisy chain", we mean the combination of a number of solder connections, electrically interconnected, each one to the next, to the same component. The set forms a measurable overall electrical resistance. Using daisy chained dummy components allows the user to focus on the failures occurring at the solder connections. This technique allows a resistor measurement to be associated to a state of damage in the soldered connections.

To qualify a circuit, we measure the failure time of its solder connections and thus the life span of its assembly. Then we deduce a reliability of the assembly resulting from a statistical study. In other words, it is necessary to test many components of the same type in order to have meaningful results. It is therefore important to have a device comprising a large number of measurement methods to be able to monitor a large number of components simultaneously.

Various devices currently exist for performing these tests. One example of such a device is described in the document "RoHS/ELV recycling constraints: a Lead Free electronics qualification procedure for automotive and industrial quality and reliability". This document presents a test bench for electronic monitoring in parallel with various tested components. Another device example is described in the document "Application of FPGA units in combined temperature cycle and vibration reliability tests of lead free interconnections". This document presents an acquisition device that monitors a set of parallel paths.

However, with the devices presented in the prior art, a crack or failure is detected only when there is a total break in the solder connection. Also, it is necessary to duplicate the testing device completely for each electronic circuit board that is tested and to change the device for each test performed. The testing device is installed on the electronic circuit board to be tested, and it undergoes the same thermo-mechanical or vibration stress as the electronic components under test. This duplication causes rather significant overhead due to the risk of non-relevant measurements and premature damage to the circuit performing the measurements.

Moreover, another drawback of the prior art is the late detection of state change events, or peaks (high variation in the resistor value over a very short time), in the electrical resistor with a number of solder connections electrically interconnected, each one to the next, on the same component (daisy chain). Such prior art devices require significant resources in terms of electrical energy in order to power multiple programmable logical circuits at the same time.

The known devices apply the IPC-SM-785 standard or detect only the first electrical resistor peaks, also called an event. However, this standard is sometimes poorly adapted for detecting failures because it takes as criteria temporal sequences of peaks corresponding to a given time and resistor pattern. This pattern or protocol may lead to incorrect conclusions. Typically, an incorrect conclusion is not detecting a break in a tested circuit because the previous pattern is strictly enforced. The result is that a circuit will be assumed as destroyed after N cycles, although it will really have failed well before. To solve this problem, in the invention, rather than it being imperative to follow the criteria (time and/or resistor pattern or protocols) in the standard, the preference criteria are modified in terms of quantities so as to adapt to the different types of tests and mechanisms of damage to the associated soldered connections. Ultimately, with the invention, each programmed criterion is adjusted to the tests to be performed.

OBJECT AND SUMMARY OF THE INVENTION

The invention thus solves this problem by proposing a device for detecting incipient cracks or failures in the solder connections of electronic components assembled on a printed circuit board, according to a criterion that is chosen and defined by the user.

The invention provides simultaneous monitoring of a large number of components in order to automatically apply a user-predetermined detection criterion that characterizes the failure of a soldered connection. The invention can directly obtain results from measurements carried out on the components, thereby avoiding any post-processing.

The invention therefore relates to a device for testing a circuit made up of a printed circuit board on which components, preferably dummy components, are assembled by means of solder connections, comprising
- an enclosure for subjecting the circuit to a schedule of thermo-mechanical and/or vibration stresses,
- a hardware portion comprising bridges of electrical resistors in order to measure the overall electrical resistance of multiple solder connections that are electrically interconnected, each one to the next,
- a software portion comprising means for setting a detection criterion representing damage to one or more solder connections that make up the assembly of an electronic component on a printed circuit board, and for displaying the results of the test, an input/output interface for converting each electrical resistor measurement of the tested chains of solder connections into data that can be used by the software portion, characterized in that it comprises, adjustment means for modifying a criterion for detecting damage to the soldered connections.

The invention also includes one of the following characteristics:

the adjustment means make it possible to modify the threshold for detecting a level of electrical resistance in the circuit under test;

the adjustment means include a potentiometer to set the threshold for detecting the level of electrical resistance in the component of the circuit under test;

the adjustment means make it possible to modify the duration of the peaks of electrical resistance to be detected;

the adjustment means include a potentiometer to set the duration of the peaks of electrical resistance to be detected;

the adjustment means make it possible to modify the number of state changes in the circuit under test to be detected in order to validate the criterion initially chosen by the user;

the adjustment means include a selector to determine a number of peaks or events to be detected for the application of the detection criterion representing damage to one or more soldered connections;

the adjustment means make it possible to modify a time interval between two state change detections in the circuit under test, with the help of a potentiometer;

the adjustment means include potentiometers to determine a time interval after a peak in order to detect a subsequent peak;

the minimum time interval between two detected state changes in a component is 250 ns;

the duration of the electrical resistance peaks to be detected is adjustable between 250 ns and 1 µs;

the duration between the start of the test and the first detected peak in electrical resistance for the criterion chosen by the user is adjustable;

the software portion includes adjustment means for recording and processing results in real time;

the software portion includes adjustment means for recording and batch processing results;

the hardware portion is integrated on an electronic board outside of the enclosure.

It also relates to a method of implementing a testing device such as previously described, in which:

parameters are initialized for detecting damage in the solder connections, state changes are detected and recorded for the electrical resistance of one or more solder connections to be tested, which is characterized by peaks of electrical resistance with a duration between 250 ns and 1 µs, state changes are transmitted to the software portion to be analyzed, it is determined whether a crack has been detected on one of the chains of soldered connections tested, and the location on the circuit of the component having this crack or electrical failure, and the associated solder connection chain, are then recorded.

BRIEF DESCRIPTION OF THE DRAWINGS

The invention will be better understood upon reading the following description and studying the figures that accompany it. They are presented for illustrative purposes only and are not limiting to the invention. The figures show.

DETAILED DESCRIPTION OF THE EMBODIMENTS

Figure 1:
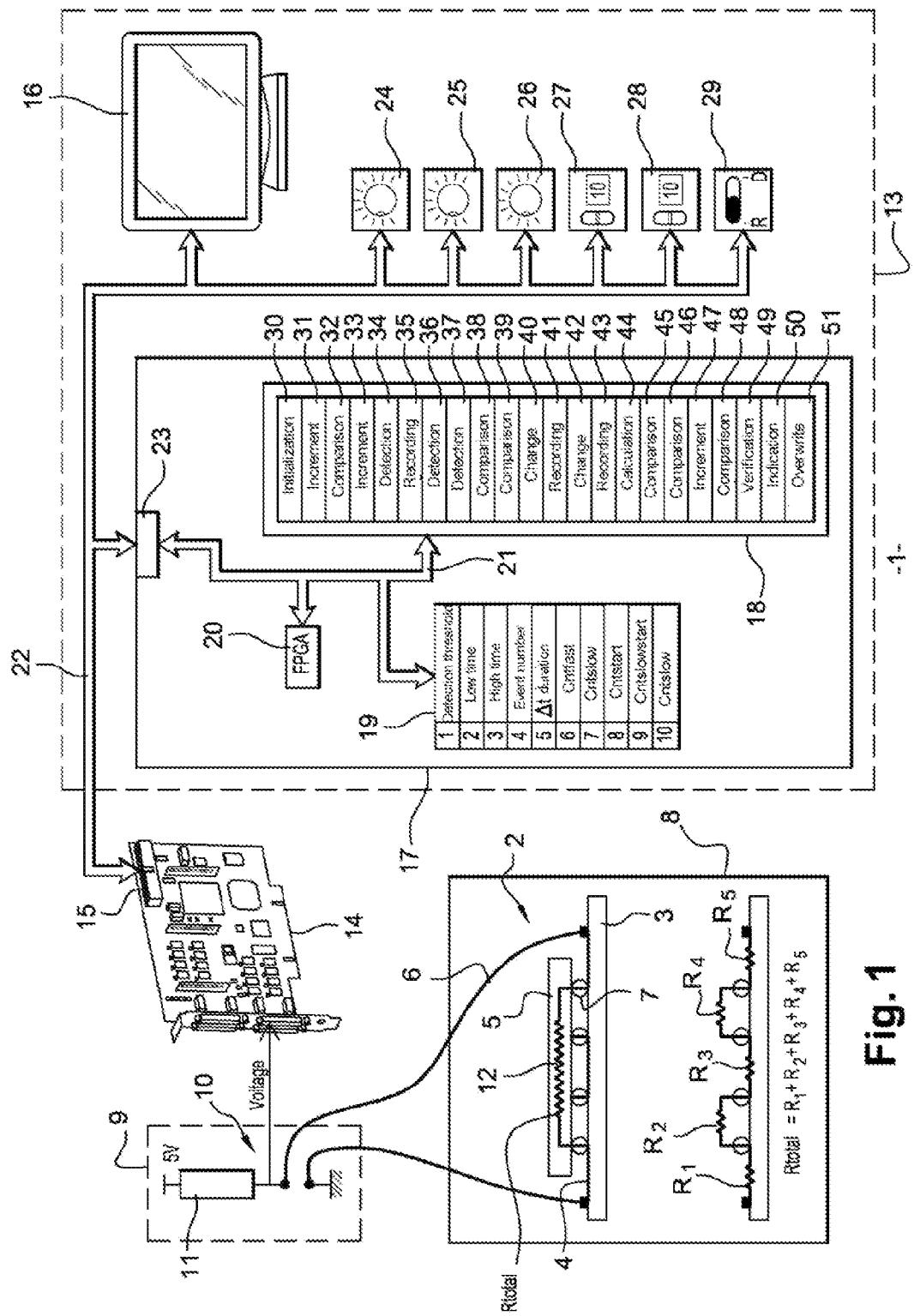
FIG. 1: a schematic representation of the device according to the invention.

FIG. 1 is a schematic representation showing an electronic circuit board 2 testing device 1 according to the invention. An electronic circuit board 2 is made up of a printed circuit board 3, whose outside is lined with a thin copper layer 4, serving as conductive tracks for the overall electrical system, on which the electronic components 5 are assembled. In order to solidify the component 5 to the printed circuit board 3 and particularly to ensure electrical continuity between the connections of the component 5 and the conductive paths formed in the copper layer 4 on the printed circuit board 3, soldered connections 7, each in the form of a solder ball (for example), are created.

The solder connections 7 suffer mechanical fatigue that causes cracks to appear. This mechanical fatigue in the solder connections 7 results from the thermo-mechanical and/or vibration stress to which the electronic component 5 and the printed circuit board 3 are subjected, particularly for circuits 2 used in methods of transportation, such as airplanes, trains, and boats. However, these methods of transportation, because they belong to the category of methods of mass transportation, require maximum security.

To solve this problem, the invention proposes implementing a circuit 2 testing device 1 for detecting possible cracks or failures in solder connections 7.

This device 1 makes it possible to evaluate the reliability of assemblies with various electronic components 5. For this, it includes a climatic enclosure 8 and/or a vibrating container in order to subject the circuit 2 to a schedule of thermo-mechanical and/or vibration stresses. The testing device 1 is preferably installed in a Faraday cage to avoid any electromagnetic interference with the measurements. This schedule of stresses is predetermined by a user. These stresses may be thermo-mechanical and/or vibration stresses. This climatic enclosure 8 can, using predetermined stresses, subject the circuit 2 to accelerated aging tests.

The device 1 includes a hardware portion 9 formed by a bridge of electrical resistors 10. This bridge of electrical resistors 10 includes at least one benchmark electrical resistor 11 that has a deemed known value and another electrical resistor 12, having an overall resistance value formed by the tested daisy chain. This daisy chain itself includes several soldered connections on the same electronic component. The electrical resistance value 12 for the electronic component under test is considered to be unknown but very low. The benchmark electrical resistance 11 is around 500Ω or a value that is much greater than the electrical resistance 12 of the component 5 under test. The bridge of electrical resistors 10 makes it possible to measure the electrical resistance of a number of solder connections that are electrically interconnected, each one to the next, to each component 5. In the invention, electrical resistance 12 is formed by the various solder connections, the electrical resistors of the tested circuit, and the electrical resistance of the paths on the printed circuit board. All of this is connected to the connections 6.

The device 1 also includes a software portion 13. This software portion 13 includes means for requiring a detection criterion that is representative of the damage to the solder connections 7. The interest of the device 1 according to the invention is to detect incipient cracks or failures, whether visible or not visible, in the solder connections 7. For this, the device 1 has a means for applying IPC criteria, published by the Institute for Interconnecting and Packaging Electronic Circuits, recognized worldwide for certification. The detection of cracks in solder connections 7 is governed, for example, by the IPC-SM-785 standard. This criterion electrically identifies the appearance of a crack in a solder connection 7 subjected to environmental or mechanic accelerated aging tests. This criterion considers that an incipient crack exists when ten successive peaks are detected for an electrical resistor 12 of the component 5 with an electrical resistance value between 300 and 500Ω and a duration between 500 ns and 1 μs. It is also necessary for this set of ten successive peaks to be produced in a time interval that is less than 10% of the time elapsed between the start of the test and the tenth detected peak.

The acquisition and coding of the analog data measured with the hardware portion 9 and the analysis of the digital data by the software portion 13 are performed by a board 14 that is outside of the enclosure. For example, this board 14 contains 160 entries to test 160 circuits such as 2 simultaneously. This board 14 makes it possible to simultaneously monitor multiple components having each one or more circuits that are identical to the circuit 2, to detect peaks of electrical resistance. The 160 entries are analyzed in parallel. Each is related to a bridge of electrical resistors 10. These bridges 10 each deliver a voltage from 0 to 1 (0-5 volts) when a crack opens and an opposite voltage when it closes. This board 14 does not support thermo-mechanical and/or vibration stresses on circuits 2 located in the enclosure 8. The board 14 can have bridges of electrical resistance 10, and in this case be connected directly to the connections 6.

When a large number of components have undergone the test, the device 1 includes means 16 for displaying the results of the measurements performed on each component. These results make it possible to determine life span statistics for assemblies made up of solder connections 7, in order to qualify sets of components 5 on the printed circuit boards 3.

To ensure the various actions of the software portion 13, it is formed by a computer system 17. This computer system 17 has an FPGA (Field Programmable Grid Array) to perform the in situ analysis of the measurements of the 160 paths 15 and display them on a means of display 16, via another communication bus 22. The computer system 17 is comprised of an input/output interface 23, allowing the buses 21 and 22 to be connected. The communication bus 21 is also connected via the communication bus 22 to adjustment means 24, 25, 26, 27, 28, 29 so that the user can modify the damage detection criteria.

The actions carried out by the computer system 17 are ordered by the FPGA 20. The FPGA 20 produces, in response to the instruction codes stored in the program memory 18, orders for the board 14 and displays the results through the means 16 of display.

The program memory has several areas of memory 30 to 51 for this purpose, respectively corresponding to a sequence of operations.

An operation 30 corresponds to initializing parameters for detecting peaks of electrical resistance or a state change. An operation 31 corresponds to incrementing a fast counter. An operation 32 corresponds to comparing the value of the fast counter with a maximum value of the fast counter. An operation 33 corresponds to incrementing a slow counter. The operations 31, 32 and 33 make it possible to accurately determine the time when a state change is detected. An operation 34 corresponds to detecting a state change from 0 to 1. An operation 35 corresponds to recording the state and counters when a change in state is detected. An operation 36 corresponds to detecting a state change from 1 to 0. An operation 37 corresponds to determining whether the state is 0 or 1. Operations 38 and 39 correspond to comparing the current state with the previous state. An operation 40 corresponds to changing a state from 0 to 1. An operation 42 corresponds to changing a state from 1 to 0. Operations 41 and 43 correspond to recording counters in variables for calculating the duration of a peak. An operation 44 corresponds to calculating the duration of detecting a peak of electrical resistance. An operation 45 corresponds to comparing the duration calculated in the operation 44 with a low duration value predetermined during the initialization operation 30. An operation 46 corresponds to comparing the duration calculated in the operation 44 with a high duration value predetermined during the initialization operation 30. An operation 47 corresponds to incrementing the number of detected peaks and then recording the calculated duration, the peak starting counter, and the measurement path number where the peak was detected. An operation 48 corresponds to comparing the peak number with the maximum number of peaks predetermined during the initialization operation 30. An operation 49 corresponds to verifying the criterion. This criterion is the detection or measure of a number of successive peaks during a time period that is less than a percentage of the time separating the start of the test and the first detected peak. If the IPC-SM-785 standard is used as a criterion, ten peaks are to be detected over a time less than 10% of the time elapsed between the start of the test and the first detected peak. An operation 50 corresponds to indicating that a failure or a crack was detected when the previous test is satisfactory and then recording the number of the measurement path where the crack is found and the starting counter value of the first peak. An operation 51 corresponds to overwriting the value of the previous peak duration with the value of the current peak if the test 49 is not satisfied.

Figure 2:
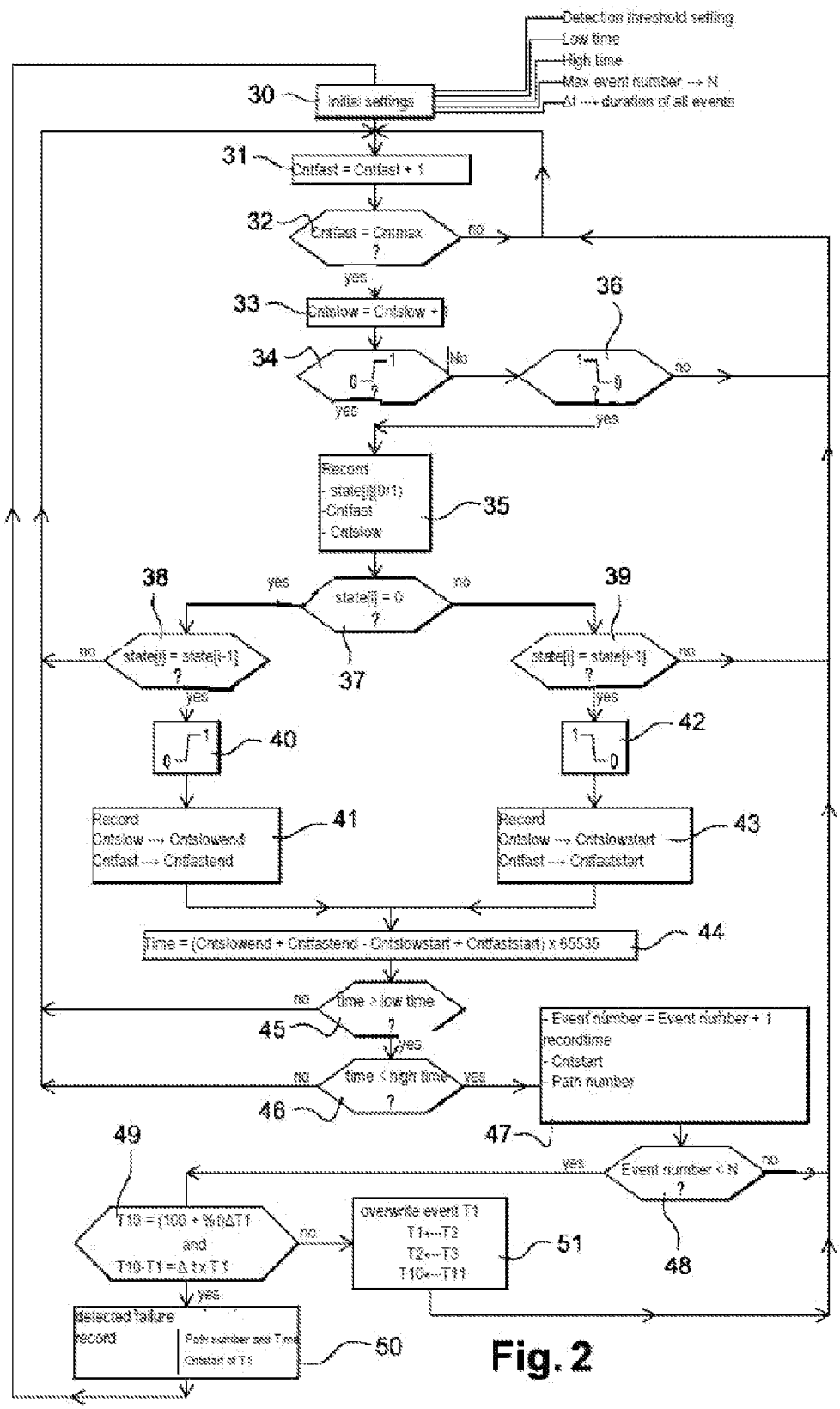
FIG. 2: a function diagram of the method according to the invention.

FIG. 2 is an example functional diagram of the method according to the invention. An overall program comprising all of the sub-programs 30 to 51 sequences these operations according to the following mode. This diagram shows the preliminary operation 30 in which parameters are initialized for detecting peaks of resistance or a state change, such as an adjustment to the threshold for detecting peaks, the low value and the high value for a duration of detecting peaks, the maximum number of peaks to be detected, the duration of detecting all peaks, and the choice of whether to save an analysis in real time or in a batch. This setting is performed respectively by the adjustment means 24, 25, 26, 27, 28, 29. In this operation, all of the counters are initialized. Once the parameters are initialized, the operation 31 can be performed.

During the operation 31, a Cntfast counter is incremented. When the Cntfast counter is incremented, the operation 32 is performed.

During the operation 32, the value of the Cntfast counter is compared with a maximum value of the Cntmax counter. This Cntmax value can, for example, be 60. When the Cntfast value reaches the Cntmax value, the operation 33 is performed; otherwise, the operation 31 is repeated.

During the operation 33, a Cntslow counter is incremented. When the Cntslow counter is incremented, the operation 34 is performed.

During the operation 34, it is determined whether a state change from 0 to 1 in the bridge 10 of resistors has taken place. When a state change from 0 to 1 has taken place, the operation 33 is performed; otherwise, the operation 36 is performed.

During the operation 35, the new state is recorded, along with the values of the Cntfast and Cntslow counters. When the new state and the counters are recorded, the operation 37 is performed.

During the operation 36, it is determined whether a state change from 1 to 0 has taken place. When a state change from 1 to 0 has taken place, the operation 36 is performed; otherwise, the operation 31 or 32 or 33 or 34 is performed.

During the operation 37, it is determined whether the new state is 0. When the new state is 0, the operation 38 is performed; otherwise, the operation 39 is performed.

During the operation 38, the new state is compared with the previous state. When the new state and the previous state are the same, the operation 40 is performed. Otherwise, the operation 31 or 32 or 33 or 34 or 35 or 36 or 37 is repeated.

During the operation 40, a state change from 0 to 1 is performed. When the state change from 0 to 1 takes place, the operation 41 is performed.

During the operation 41, the value of the Cntslow counter is recorded in a Cntslowstart variable, and the value of the Cntfast counter is recorded in a Cntfaststart variable. When the counters are recorded, the operation 44 is performed.

During the operation 39, the new state is compared with the previous state. When the new state and the previous state are the same, the operation 42 is performed. Otherwise, the operation 31 or 32 or 33 or 34 or 35 or 36 or 37 is repeated.

During the operation 42, a state change from 1 to 0 is performed. When the state change from 1 to 0 takes place, the operation 43 is performed.

During the operation 43, the value of the Cntslow counter is recorded in a Cntslowend variable, and the value of the Cntfast counter is recorded in a Cntfastend variable. When the counters are recorded, the operation 44 is performed.

During the operation 44, the peak detection duration is calculated, corresponding to the difference between the sum of the values of the Cntslowend and Cntfastend variables and the sum of the values of the Cntslowstart and Cntfaststart variables. This difference is returned in nanosecond units. When the peak detection duration is calculated, the operation 45 is performed.

During the operation 45, the calculated duration is compared with a low value for the peak detection duration that was predetermined during the operation 30. When the calculated duration is greater than the predetermined low duration, the operation 46 is performed; otherwise, the operation 31 is repeated.

During the operation 46, the calculated duration is compared with a high value for the peak detection duration that was predetermined during the operation 30. When the calculated duration is less than the predetermined low duration, the operation 47 is performed; otherwise, the operation 31 is repeated.

During the operation 47, the number of detected peaks is incremented, and the calculated duration, the detected peak starting counter, and the measurement path number where the peak was detected are recorded. When this increment has been completed, the operation 48 is performed.

During the operation 48, the number of peaks is compared with the maximum number of peaks predetermined in the operation 30. When the number of detected peaks is less than the predetermined maximum peak number, the operation 49 is performed; otherwise, the operation 31 is repeated.

During the operation 49, it is verified that ten successive peaks have successfully been detected over a time period predefined by the user. When ten successive peaks have been detected, the operation 50 is performed; otherwise, the operation 51 is performed.

During the operation 50, it is indicated that a failure or crack was detected, and the measurement path number where the failure was detected, the detection duration of the ten peaks, and the starting counter of the first peak are all recorded. When the failure is indicated, the operation 30 is repeated; otherwise, the operation 51 is performed.

During the operation 51, the value of the previous peak detection duration is overwritten with the current peak detection duration. When this overwrite is performed, the operation 31 is repeated.

The invention claimed is:

1. A device for testing a circuit comprising a printed circuit board on which electronic components are assembled by means of solder connections, comprising
    a climatic enclosure for subjecting the circuit under test to a schedule of thermo-mechanical or vibration stresses;
    a hardware component comprising bridges of electrical resistors to measure an overall electrical resistance of multiple solder connections of the circuit under test that are electrically interconnected, each one to the next;
    a computer system for performing in situ analysis of the measurement provided by the hardware component and further comprising:
        a software component executed by the computer system sets a detection criterion representing damage to one or more solder connections that make up the assembly of electronic components on the printed circuit board for a test;
        a display for displaying the results of the test;
        an input/output interface for converting each electrical resistor measurement of chains of solder connections tested into data for use by the software component; and
        wherein the software component is operable to modify the detection criterion for detecting damage to the soldered connections.

2. The device of claim 1, wherein the software component is operable to modify a threshold for detecting a level of electrical resistance in the circuit under test.

3. The device of claim 2, wherein the software component is operable to set the threshold for detecting the level of electrical resistance in the electronic component of the circuit under test.

4. The device of claim 1, wherein the software component is operable to modify a number of state changes in the circuit under test to be detected in order to validate the detection criterion initially selected by a user.

5. The device of claim 4, wherein the software component is operable to determine a number of peaks to be detected for an application of the detection criterion.

6. The device of claims 1, wherein the software component is operable to modify a time interval between two state change detections in the circuit under test.

7. The device of claim 6, wherein the software component is operable to determine a time interval after a peak in order to detect a subsequent peak.

8. The device of claim 6, wherein a minimum time interval between two detected state changes in a electronic component is 250 ns.

9. The device of claim 1, wherein a duration of the electrical resistance peaks to be detected is adjustable between 250 ns and 1 µs.

10. The device of claim 9, wherein a duration between the start of the test and a first detected peak in electrical resistance for the detection criterion selected by a user is adjustable.

11. The device of claim 1, wherein the software component is operable to record and process results of the test in real time.

12. The device of claim 1, wherein the hardware component is integrated on a printed circuit board outside of the enclosure.

13. The device of claim 1, wherein the electronic components are dummy components.

14. A method for testing a circuit comprising a printed circuit board on which electronic components are assembled by means of solder connections using the device of claim 1, comprising the steps of:

- initializing parameters for detecting damage in the solder connections by the software component of the computer system;
- detecting and recording state changes for the electrical resistance of one or more solder connections to be tested by the hardware component, which is characterized by peaks of electrical resistance with a duration between 250 ns and 1 µs;
- transmitting state changes to the software component for analysis by the input/output interface of the computer system; and
- recording, by the computer system, a location of the electronic component on the circuit under test and an associated solder connection chain if a crack is detected on one of the chains of the soldered connections tested.

* * * * *